United States Patent
Broberg et al.

(10) Patent No.: US 6,801,552 B1
(45) Date of Patent: Oct. 5, 2004

(54) METHOD AND ARRANGEMENT FOR CONTROLLING A TUNEABLE LASER

(75) Inventors: Björn Broberg, Djursholm (SE); Markus Renlund, Boston, MA (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 10/030,233

(22) PCT Filed: Jun. 21, 2000

(86) PCT No.: PCT/SE00/01320

§ 371 (c)(1),
(2), (4) Date: May 13, 2002

(87) PCT Pub. No.: WO01/03262

PCT Pub. Date: Jan. 11, 2001

(30) Foreign Application Priority Data

Jul. 6, 1999 (SE) ............................. 9902604

(51) Int. Cl.[7] .............................................. H01S 3/13
(52) U.S. Cl. .............................. 372/29.015; 372/29.01; 372/38.1; 372/38.01; 372/38.02; 372/38.04
(58) Field of Search ........................ 372/34, 58, 29.014

(56) References Cited

U.S. PATENT DOCUMENTS

| | | | | |
|---|---|---|---|---|
| 5,488,503 A | * | 1/1996 | Schaffner et al. | ........... 359/245 |
| 5,602,860 A | * | 2/1997 | Masonson | ..................... 372/34 |
| 5,754,579 A | * | 5/1998 | Mizoguchi et al. | ........... 372/58 |
| 5,872,479 A | * | 2/1999 | Shin | ............................ 327/537 |
| 5,917,637 A | * | 6/1999 | Ishikawa et al. | ........ 372/29.014 |
| 6,064,681 A | | 5/2000 | Ackerman | .................... 372/32 |
| 6,323,726 B1 | * | 11/2001 | Berger et al. | ................ 327/551 |

FOREIGN PATENT DOCUMENTS

| | | |
|---|---|---|
| WO | WO 99/40654 | 8/1999 |
| WO | WO 00/54380 | 9/2000 |

* cited by examiner

*Primary Examiner*—Don Wong
*Assistant Examiner*—Cornelius H Jackson
(74) *Attorney, Agent, or Firm*—Carlson, Caspers, Vandenburgh & Lindquist

(57) ABSTRACT

A method of controlling a tuneable laser that has been characterized with respect to one or more suitable laser operation points. Each operation point is determined by the manner in which the different laser sections are controlled, in order to operate the laser at a predetermined operation point. The voltage across the different laser section is determined for different operation points when controlling the laser, and the voltages across the different laser sections are held constant when the laser is in operation to maintain a predetermined operation point.

8 Claims, 2 Drawing Sheets

METHOD AND ARRANGEMENT FOR CONTROLLING A TUNEABLE LASER

BACKGROUND OF THE INVENTION

1. Field of the Invention

The present invention relates to a method and to an arrangement for controlling a tuneable laser.

2. Description of the Related Art

Tuneable semiconductor lasers include several different sections through which current is injected, these sections typically being three or four in number. The wavelength, power, and mode purity of the lasers can be controlled by adjusting the current in the various sections. Mode purity implies that the laser is at an operation point, i.e., at a distance from a combination of the drive currents where so-called mode jumps occur and where lasing is stable and side mode suppression is high.

Special requirements are required for different applications with respect to controlling wavelength. In the case of telecommunications applications, it is necessary that the laser be able to retain its wavelength to a very high degree of accuracy over long periods of time, after having set the drive currents and the temperature. A typical accuracy is 0.1 nanometer and a typical time period is 20 years.

In order to be able to control the laser, it is necessary to map the behavior of the laser as a function of the various drive currents. This is necessary prior to using the laser after its manufacture.

Various methods of characterizing tuneable lasers with respect to optimizing their operation points are described in Swedish Patent Specifications 9800143-1 and 9900536-5.

However, it is also necessary to determine the degradation of a laser in operation in order to be able to compensate for degradation by changing the drive currents. A change in wavelength for a given operation point is one example of degradation.

Conventionally, tuneable lasers are controlled by adjusting the current injected into the various laser sections so as to maintain a certain desired operation point.

One method of discovering laser degradation is to recharacterize the laser after a given time period, and then compare earlier combinations with the current combinations last measured, to determine the extent to which the laser may have degraded. The current control of the various sections of the laser is then adjusted to obtain the desired operation point.

SUMMARY OF THE INVENTION

The present invention relates to a method and to an arrangement with which changes in the laser operation point with respect to transmitted wavelength, power, and side mode suppression due to degradation is compensated, to greatly reduce the influence of this degradation or to eliminate its influence entirely.

Accordingly, the present invention relates to a method of controlling a tuneable laser which has been characterized with respect to one or more suitable laser operation points, wherein each of the operation points is determined by the extent to which the various sections of the laser are controlled to result in the laser operating at a predetermined operation point. The laser control voltage across the different sections for different operation points is determined, and the voltage across the various sections of the laser is held constant during operation of the laser over time to thereby maintain a predetermined operation point.

The invention also relates to an arrangement that includes a voltage unit which during operation of the laser functions to hold the voltage across the different laser sections constant over time, in accordance with the voltage that was measured across the different laser sections in respect of the different operation points that were measured when characterizing the laser, to maintain a predetermined operation point.

BRIEF DESCRIPTION OF THE DRAWINGS

The invention will now be described in more detail with reference to exemplifying embodiments thereof and also with reference to the accompanying drawings, in which.

DESCRIPTION OF THE PREFERRED EMBODIMENTS

Figure 1:
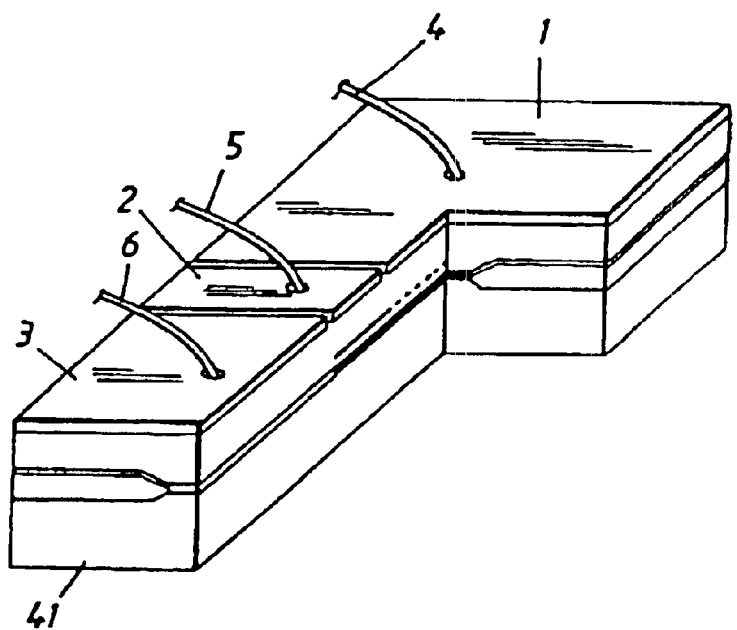
FIG. 1 is a partially cut-away perspective view of a DBR laser.

FIG. 1 illustrates a DBR laser which includes three sections, namely a Bragg reflector 1, a phase section 2, and a gain section 3. Each section is controlled by injecting current thereinto through respective electrical conductors 4, 5, 6.

Figure 2:
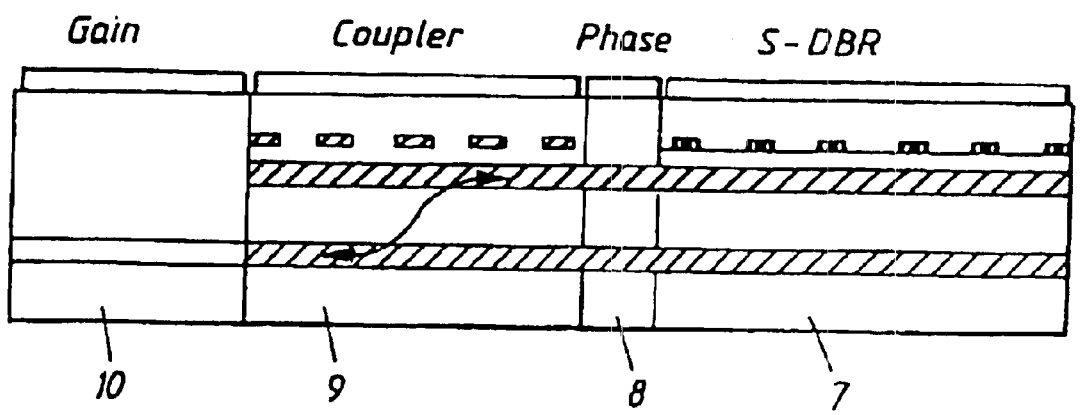
FIG. 2 is a sectional view of a tuneable Grating Coupled Sampled Reflector (GCSR) laser.

FIG. 2 is a sectional view of a tuneable Grating Coupled Sampling Reflector (GCSR) laser. Such a laser has four sections, namely a Bragg reflector 7, a phase section 8, a coupler 9, and a gain section 10. Each of the sections is controlled by injecting current thereinto.

Figure 3:
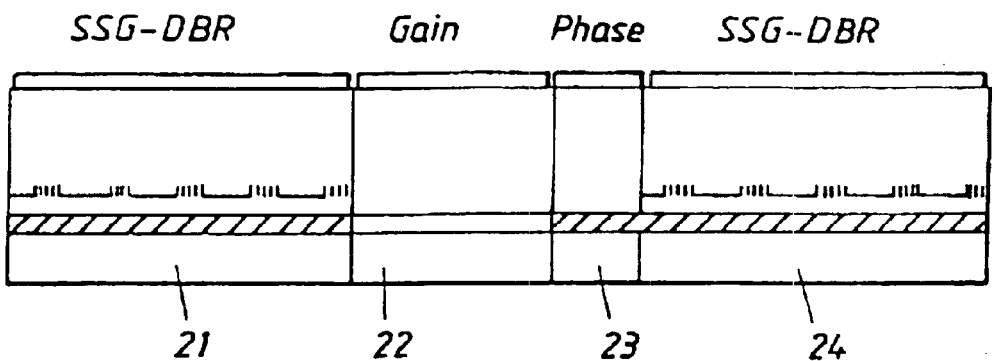
FIG. 3 is a sectional view of a Sampled Grating DBR laser.

FIG. 3 is a sectional view of a Sampled Grating DBR laser, which also has four sections referenced 21, 22, 23, 24, respectively. The sections 21 and 24 are Bragg reflectors, whereas section 23 is the phase section, and section 22 is the gain section.

The aforesaid three types of lasers are common. However, other types of lasers exist.

Although the invention is described below mainly with reference to a GCSR laser according to FIG. 2, it will be understood that the invention is not restricted to any particular kind of tuneable semiconductor lasers. For instance, the invention can be applied in a corresponding manner with tuneable lasers other than those shown in the Figures.

The wavelength emitted by a tuneable laser is determined by the amount of current that is injected into the different laser sections. Wavelength is determined by the number of free charge carriers to which the injected current gives rise. Degradation in the relationship between wavelength and current can occur in time and thereby destroy the wavelength accuracy of the laser.

This degradation occurs primarily in the relationship between current and refractive index, by virtue of a change in the ratio between the injected current and the number of charge carriers.

The ratio between the number of charge carriers and refractive index, and therewith wavelength, however, can be considered to be constant.

Thus, the invention relates to a method of controlling a tuneable laser which has earlier been characterized with respect to one or more suitable laser operation points. The operation points are determined by the current to be injected into the different laser sections, or by the voltage that exists across respective sections, in order for the laser to operate at a predetermined operation point.

According to the invention, the voltage across the different laser sections for different laser operation points is determined when characterizing the laser. In operation, the voltage across the different laser sections is held constant over time to maintain a predetermined operation point.

The laser can be characterized in accordance with the aforesaid patent specifications, such as to identify a large number of operation points, and thereafter select a given operation point. However, the invention can also be applied when the laser is controlled digitally or analogously to obtain a given operation point. The invention is therefore not dependent on how a given operation point is obtained.

In fact, the relationship between the current that passes through a section and the applied voltage across said section is not linear, and, furthermore, is changed with degradation of the laser. This applies to all laser sections.

Figure 4:
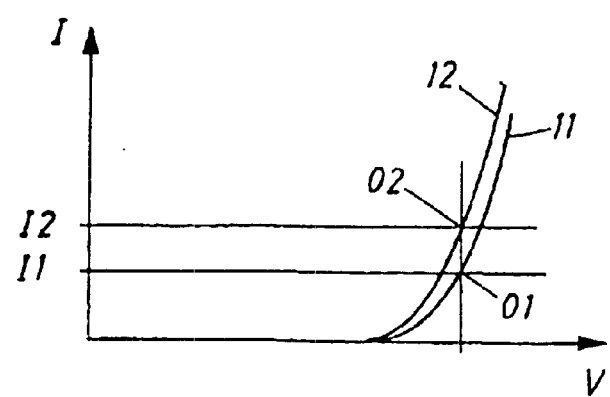
FIG. 4 shows principal curves in a graph in which current injected in one tuning section is plotted against the voltage across said section.

FIG. 4 is a graph in which the current I through one section has been plotted against the voltage across said section. The curve 11 shows this relationship when characterizing the laser prior to its degradation. The point 01 shows a selected operation point. The position of the curve 11 moves to the position of the curve 12 when degradation occurs. Thus, the operation point can be caused to move to the point 02 by holding the voltage constant. The result of holding the voltage constant is thus to increase the current through the section from 11 to 12.

This is preferably effected by causing the voltage unit 13 (see FIG. 5) to supply voltage to each of the laser sections with predetermined constant voltages across respective sections.

This results in automatic correction of the current through respective sections and in a constant quantity of free charge carriers, even when the ratio between injected current and the number of charge carriers changes. This applies to all sections of the laser.

Consequently, the wavelength of the emitted light will be held constant over said time period, even should the laser degrade. Although an exact wavelength may not be maintained over the full time period, the influence of degradation will at least be greatly reduced.

As distinct from conventional processes, it is not necessary to measure the current nor to correct the current to a certain predetermined value.

In actual fact, it is unnecessary to know the extent to which the laser has degraded in order to maintain a given operation point, and therewith the wavelength, when practicing the present invention.

The present invention thus solves the problem disclosed in the introduction.

Figure 5:
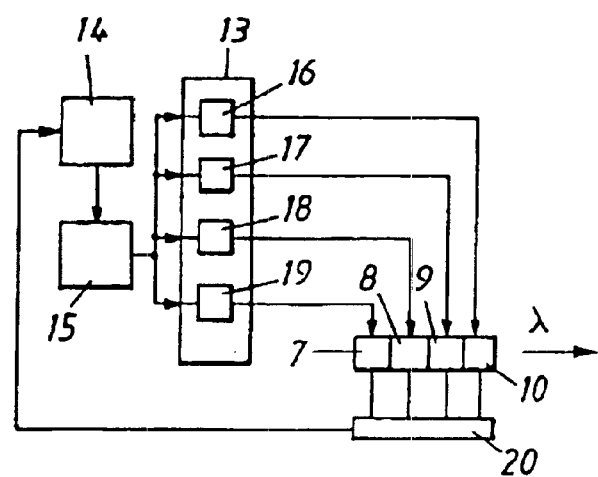
FIG. 5 is a block diagram illustrating schematically an arrangement that can be used in accordance with the invention.

FIG. 5 is a block diagram of an arrangement used in accordance with the invention.

In operation, the voltage unit 13 functions to keep the voltage across the different laser sections 7–10 constant over a time period for maintaining a predetermined operation point. The various voltages required in this respect are determined, when characterizing or controlling the laser, as relevant voltages across the various laser sections for different operation points.

When characterizing the laser, for instance in accordance with the aforesaid patent specifications, the voltage across the various laser sections can be measured in respect of the different operation points.

The arrangement includes a microprocessor 14, or some corresponding device, for controlling four different voltage generators 16–19 via a D/A converter 15. Each of the voltage generators 16–19 controls one of the laser sections 7–10. The microprocessor 14 is connected to a storage unit (not shown) in which the different operation points are stored in the form of that voltage [which shall prevail] that exists across respective laser sections.

According to one preferred embodiment, the arrangement includes a circuit 20 which is adapted to measure the voltage across respective sections 7–10. The circuit 20 is designed to adjust the voltage unit 13 so that it will maintain a predetermined voltage for each laser section. This is effected in response to a signal delivered to the microprocessor 14 from the circuit 20 and representing respective measured voltages.

The microprocessor 14 and the D/A converter 15 can be replaced with a fully analog circuit. In such case, the circuit 20 may also be included in a similar analog circuit.

Although the invention has been described above with reference to an exemplifying embodiment thereof, it will be understood that the invention can be applied correspondingly to types of tuneable lasers other than a GCSR laser. The voltage generators may also be given any suitable design, as can also the circuit 20.

The present invention shall not therefore be considered limited to the aforedescribed embodiment, since variations can be made within the scope of the following claims.

What is claimed is:

1. A method of controlling a tuneable laser having different laser sections, the laser having been characterized with respect to one or more laser operation points, each of the laser operation points corresponding to a set of different control conditions for the different laser sections, the method comprising:

determining respective voltages across the different laser sections when operating the tuneable laser; and holding the determined respective voltages across the different laser sections at constant levels when operating the tuneable laser so as to maintain a desired laser operation point.

2. A method according to claim 1, wherein holding the determined respective voltages comprises applying a set of predetermined constant voltages across respective laser sections of the tuneable laser from a voltage source.

3. A method according to claim 2, further comprising measuring the voltages across the respective laser sections, and adjusting the voltage source to maintain the predetermined voltages across each respective laser section.

4. A method according to claim 3, wherein adjusting the voltage source comprises changing electrical currents applied to each laser section so as to maintain the predetermined voltages constant.

5. An arrangement for controlling a tuneable laser having different laser sections, the tuneable laser having been characterized with respect to at least one suitable laser operation point, the at least one laser operation point corresponding to a respective set of predetermined voltages applied respectively to the different laser sections, the controlling arrangement comprising:

the tuneable laser having different laser sections;

a voltage unit coupled to the tuneable laser to apply different voltages to the different laser sections respectively, the voltage unit being adapted to hold the applied voltages at constant levels corresponding to the set of predetermined voltages associated with a desired laser operation point, so as to maintain operation of the tuneable laser at the desired laser operation point; and a circuit to measure voltages across the different laser sections, the circuit being adapted to adjust the voltage source to maintain the predetermined voltages across each laser section.

6. An arrangement according to claim 5, wherein the tuneable laser includes a Bragg reflector.

7. An arrangement according to claim 6, wherein the tuneable laser is a distributed Bragg reflector (DBR) laser.

8. An arrangement according to claim 6, wherein the tuneable laser is a grating coupled sampling reflector (GCSR) laser.

* * * * *